(12) United States Patent
Zhu et al.

(10) Patent No.: US 12,207,479 B2
(45) Date of Patent: Jan. 21, 2025

(54) SEMICONDUCTOR STRUCTURE AND FORMATION METHOD THEREOF

(71) Applicant: CHANGXIN MEMORY TECHNOLOGIES, INC., Hefei (CN)

(72) Inventors: Yiming Zhu, Hefei (CN); Xiaoguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 485 days.

(21) Appl. No.: 17/455,487

(22) Filed: Nov. 18, 2021

(65) Prior Publication Data

US 2022/0208854 A1 Jun. 30, 2022

Related U.S. Application Data

(63) Continuation of application No. PCT/CN2021/095830, filed on May 25, 2021.

(30) Foreign Application Priority Data

Dec. 29, 2020 (CN) .......................... 202011597947.7

(51) Int. Cl.
H10B 61/00 (2023.01)
(52) U.S. Cl.
CPC .................................. *H10B 61/22* (2023.02)
(58) Field of Classification Search
CPC ........ H10B 61/22; H10B 12/00; H10B 12/31; H10B 12/30
See application file for complete search history.

(56) References Cited

U.S. PATENT DOCUMENTS

| 6,121,080 | A | 9/2000 | Wu |
| 10,199,379 | B2 | 2/2019 | Cho et al. |
| 10,373,959 | B2 | 8/2019 | Im et al. |
| 2006/0237726 | A1 | 10/2006 | Iwamatsu |
| 2008/0073709 | A1 | 3/2008 | Fujimoto et al. |

(Continued)

FOREIGN PATENT DOCUMENTS

| CN | 1495906 A | 5/2004 |
| CN | 1702869 A | 11/2005 |

(Continued)

OTHER PUBLICATIONS

T. Schloesser et al., "A 6F2 Buried Wordline DRAM Cell for 40nm and Beyond", Authorized licensed use limited to: University of Science & Technology of China. Downloaded on Nov. 26, 2020 at 23:08:16 UTC from IEEE Xplore. Restrictions apply, 4 pages.

(Continued)

*Primary Examiner* — Shih Tsun A Chou
(74) *Attorney, Agent, or Firm* — Kilpatrick Townsend & Stockton LLP

(57) ABSTRACT

A semiconductor structure comprises: a substrate; a first transistor including a first gate located in the substrate and a first terminal located on a surface of the substrate, the first terminal being configured to be connected to a first-type memory cell; and a second transistor including a second gate located in the substrate and a second terminal located on the surface of the substrate, the second terminal being configured to be connected to a second-type memory cell, and a width of the second gate being less than a width of the first gate.

15 Claims, 3 Drawing Sheets

(56) References Cited

U.S. PATENT DOCUMENTS

| | | | |
|---|---|---|---|
| 2011/0215382 A1 | 9/2011 | Asao et al. | |
| 2013/0153998 A1* | 6/2013 | Song | H10B 10/00 |
| | | | 257/334 |
| 2014/0077303 A1 | 3/2014 | Baek | |
| 2016/0284405 A1* | 9/2016 | Ueki | H10B 63/80 |
| 2017/0033279 A1 | 2/2017 | Lee | |

FOREIGN PATENT DOCUMENTS

| | | |
|---|---|---|
| CN | 102214578 A | 10/2011 |
| CN | 103904082 A | 7/2014 |
| CN | 106935508 A | 7/2017 |
| CN | 107731907 A | 2/2018 |
| CN | 108133936 A | 6/2018 |
| CN | 109524399 A | 3/2019 |
| CN | 110111822 A | 8/2019 |
| CN | 209641689 U | 11/2019 |
| CN | 110943102 A | 3/2020 |
| CN | 111223862 A | 6/2020 |
| CN | 111755386 A | 10/2020 |
| CN | 111799260 A | 10/2020 |
| JP | H08316427 A | 11/1996 |
| JP | 2014049725 A | 3/2014 |

OTHER PUBLICATIONS

An Chen, "A review of emerging non-volatile memory (NVM) technologies and applications", SSE, 2016, Solid-State Electronics, 14 pages.

P. M. Kibuule et al., "CMOS Effective Channel Size Measurements", Superconducting Super Collider Laboratory, 2550 Beckleymeade Ave. Dallas, TX 75237, Jan. 1994, 8 pages.

International Search Report in the international application No. PCT/CN2021/095830, mailed on Sep. 13, 2021, 5 pages.

* cited by examiner

SEMICONDUCTOR STRUCTURE AND FORMATION METHOD THEREOF

CROSS-REFERENCE TO RELATED APPLICATIONS

This application is a continuation application of International Patent Application No. PCT/CN2021/095830, filed on May 25, 2021, which claims priority to Chinese Application No. 202011597947.7, filed on Dec. 29, 2020. The disclosures of International Patent Application No. PCT/CN2021/095830 and Chinese Application No. 202011597947.7 are incorporated herein by reference in their entireties.

TECHNICAL FIELD

The present application relates to the field of semiconductor fabrication technologies, and in particular, to a semiconductor structure and a formation method thereof.

BACKGROUND

A Dynamic Random Access Memory (DRAM) is a semiconductor device commonly used in electronic equipment such as computers, which consists of a plurality of memory cells. Each memory cell generally comprises a transistor and a capacitor. In the transistor, a gate is electrically connected to a wordline, a source is electrically connected to a bitline, and a drain is electrically connected to the capacitor. A wordline voltage on the wordline can control ON and OFF of the transistor, so that the bitline can read data information stored in the capacitor or write data information in the capacitor.

A Magnetic Random Access Memory (MRAM) is based on integration of silicon-based complementary metal oxide semiconductor (CMOS) and Magnetic Tunnel Junction (MTJ) technologies and is a nonvolatile memory, which has high-speed read and write capability of a static random access memory and high integration of the dynamic random access memory. The magnetic tunnel junction generally comprises a fixed layer, a tunnel layer and a free layer. When the magnetic random access memory is operating normally, a magnetization direction of the free layer can be changed, while a magnetization direction of the fixed layer remains unchanged. Resistance of the magnetic random access memory is related to a relative magnetization direction of the free layer and the fixed layer. When the magnetization direction of the free layer is changed relative to the magnetization direction of the fixed layer, a resistance value of the magnetic random access memory is changed accordingly, corresponding to different stored information.

In order to increase memory density of a memory and reduce a size of the memory cell, a Buried WordLine (BWL) has been widely used in the DRAM. However, in order to avoid current leakage, the DRAM having a buried wordline structure is required to use a relatively small drive current to drive the transistor. However, the MARM is required to use a relatively large drive current to drive the transistor due to a need to ensure turn-on of a MTJ switch. Due to a difference between the drive current of the DRAM and the drive current of the MARM, the buried wordline structure cannot be implemented in the MARM currently, thereby limiting an increase in the memory density of the MARM and a reduction in the size of the memory cell.

Therefore, how to improve performance of a memory so as to expand an application field of the memory is a technical problem to be urgently solved currently.

SUMMARY

A semiconductor structure, comprising:
a substrate;
a first transistor including a first gate located in the substrate and a first terminal located on a surface of the substrate, the first terminal being configured to be connected to a first-type memory cell; and
a second transistor including a second gate located in the substrate and a second terminal located on the surface of the substrate, the second terminal being configured to be connected to a second-type memory cell, and a width of the second gate being less than a width of the first gate.

In one of the embodiments, the semiconductor structure further comprises:
a plurality of active regions arranged in an array in the substrate; and
a shallow trench isolation structure located between adjacent active regions.

In one of the embodiments, the plurality of active regions have at least one first active region; the first active region having two first transistors;
the two first transistors being distributed on two opposite sides of an extension direction of the first active region, and the two first transistors located in the first active region having a first common terminal.

In one of the embodiments, the plurality of active regions have at least one second active region; the second active region having two second transistors;
the two second transistors being distributed on two opposite sides of an extension direction of the second active region, and the two second transistors located in the second active region having a second common terminal.

In one of the embodiments, the plurality of active regions have at least one third active region; the third active region having a first transistor and a second transistor;
the first transistor and the second transistor being distributed on two opposite sides of an extension direction of the third active region, and the first transistor and the second transistor located in the third active region having a third common terminal.

In one of the embodiments, the semiconductor structure further comprises a plurality of wordlines extending in a first direction; and
the plurality of third active regions are arranged in an array in the substrate, the third active regions extending in a second direction, and the second direction is tilted by a preset angle relative to the first direction.

In one of the embodiments, in the second direction, ends of two adjacent third active regions close to each other are both the first transistor or both the second transistor.

In one of the embodiments, one third active region overlaps with two adjacent wordlines; and
the first transistor and the second transistor located in a same third active region correspond to the two wordlines respectively.

In one of the embodiments, the wordline comprises first subwordlines and second subwordlines arranged alternately in a third direction, the third direction being perpendicular to the first direction;
the first transistors in the plurality of third active regions arranged in the first direction overlap with a same first subwordline; and the second transistors in the plurality of third active regions arranged in the first direction overlap with a same second subwordline.

In one of the embodiments, a width of the second subwordline is less than a width of the first subwordline.

In one of the embodiments, the width of the second gate is ⅓ to ½ of the width of the first gate.

In one of the embodiments, in the first direction, in two adjacent third active regions, the first transistor in one third active region and the second transistor in the other third active region correspond to a same wordline, and the wordline is periodically concave and convex.

In one of the embodiments, the width of the second gate is ½ to ⅔ of the width of the first gate.

In one of the embodiments, the first-type memory cell comprises any one of a capacitive memory cell, a resistive memory cell, a magnetic memory cell, a phase change memory cell and a ferroelectric memory cell;
the second-type memory cell comprises any one of a capacitive memory cell, a resistive memory cell, a magnetic memory cell, a phase change memory cell and a ferroelectric memory cell; and
the first-type memory cell and the second-type memory cell are of different memory types.

In one of the embodiments,
the first-type memory cell is the capacitive memory cell; and
the second-type memory cell is the magnetic memory cell.

A method for forming a semiconductor structure, comprising:
providing a substrate; and
forming a first transistor and a second transistor, the first transistor including a first gate located in the substrate and a first terminal located on a surface of the substrate, the first terminal being configured to be connected to a first-type memory cell, the second transistor including a second gate located in the substrate and a second terminal located on the surface of the substrate, the second terminal being configured to be connected to a second-type memory cell, and a width of the second gate being less than a width of the first gate.

In one of the embodiments, the semiconductor structure formation method further comprises the following steps:
forming an active region in the substrate;
forming a first gate groove and a second gate groove in the active region, a width of the second gate groove being less than a width of the first gate groove, the active region being divided by the first gate groove and the second gate groove into the first terminal, the second terminal and a common terminal between the first terminal and the second terminal; and
filling the first gate groove and the second gate groove with a gate material, to form the first gate and the second gate.

In one of the embodiments, the substrate further comprises a plurality of wordlines extending in a first direction; and
a plurality of active regions are arranged in an array in the substrate, the active regions extend in a second direction, and the second direction is tilted by a preset angle relative to the first direction.

In one of the embodiments, in the second direction, ends of two adjacent active regions close to each other are both the first transistor or the second transistor.

In one of the embodiments, one active region overlaps with two adjacent wordlines; and
the first transistor and the second transistor located in a same active region correspond to the two wordlines respectively.

In one of the embodiments, the wordline comprises first subwordlines and second subwordlines arranged alternately in a third direction, the third direction being perpendicular to the first direction;
the first transistors in the plurality of active regions arranged in the first direction overlap with a same first subwordline; and
the second transistors in the plurality of active regions arranged in the first direction overlap with a same second subwordline.

In one of the embodiments, a width of the second subwordline is less than a width of the first subwordline.

In one of the embodiments, in the first direction, in two adjacent active regions, the first transistor in one active region and the second transistor in the other active region correspond to a same wordline, and the wordline is periodically concave and convex.

In one of the embodiments, the first-type memory cell comprises any one of a capacitive memory cell, a resistive memory cell, a magnetic memory cell, a phase change memory cell and a ferroelectric memory cell;
the second-type memory cell comprises any one of a capacitive memory cell, a resistive memory cell, a magnetic memory cell, a phase change memory cell and a ferroelectric memory cell; and
the first-type memory cell and the second-type memory cell are of different memory types.

In one of the embodiments, the first-type memory cell is the capacitive memory cell; and
the second-type memory cell is the magnetic memory cell.

In the semiconductor structure and the formation method thereof according to some embodiments, the first transistor connected to the first-type memory cell and the second transistor connected to the second-type memory cell are arranged simultaneously in the semiconductor structure, and the width of the second gate of the second transistor is less than the width of the first gate of the first transistor, so as to achieve an effect of enabling a fabrication process of the first transistor to be compatible with a fabrication process of the second transistor, thereby simplifying a fabrication method of the semiconductor structure. Moreover, the drive current of the first transistor can be ensured to be less than that of the second transistor, which helps to increase integration density of the memory cell of the first transistor and/or the second transistor in a memory, reduces a size of the memory cell, improves performance of the memory, and lays a foundation for expansion of the application field of the memory.

BRIEF DESCRIPTION OF DRAWINGS

The disclosure will be understood more fully from the detailed description given below and from the accompanying drawings of various implementations of the disclosure.

DESCRIPTION OF EMBODIMENTS

Specific implementations of the semiconductor structure and the formation method thereof according to the disclosure are described in detail below with reference to the accompanying drawings.

Figure 1:
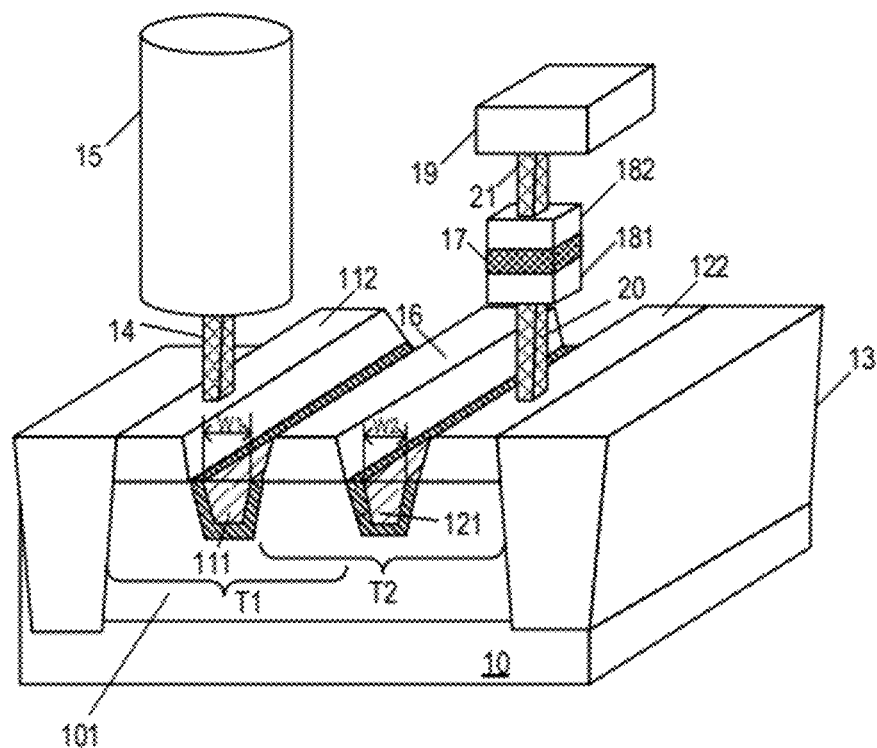
FIG. 1 is a schematic diagram of a semiconductor structure according to a specific implementation of an embodiment.

The specific implementations provide a semiconductor structure. FIG. 1 is a schematic diagram of a semiconductor structure according to a specific implementation of an embodiment. As shown in FIG. 1, the semiconductor structure according to this specific implementation comprises:

a substrate 10;

a first transistor T1 including a first gate 111 located in the substrate 10 and a first terminal 112 located on a surface of the substrate 10, the first terminal 112 being configured to be connected to a first-type memory cell 15; and a second transistor T2 including a second gate 121 located in the substrate 10 and a second terminal 122 located on the surface of the substrate 10, the second terminal 122 being configured to be connected to a second-type memory cell 17, and a width W2 of the second gate 121 being less than a width W1 of the first gate 111;

a plurality of active regions arranged in an array in the substrate; and a shallow trench isolation structure located between adjacent active regions.

Specifically, as shown in FIG. 1, the substrate 10 may be, but is not limited to, a silicon substrate. This specific implementation is illustrated with an example in which the substrate 10 is a silicon substrate. In other examples, the substrate 10 may be a gallium nitride, gallium arsenide, gallium carbide, silicon carbide or SOI semiconductor substrate. The substrate 10 is also provided with a plurality of active regions arranged in an array, and adjacent active regions are isolated from each other by a shallow groove isolation structure 13. The first transistor T1 and the second transistor T2 may be located in a same active region or in different active regions, which may be set by those skilled in the art according to an actual requirement.

The width W1 of the first gate 111 may be a length of the first gate 111 in a direction perpendicular to an extension direction thereof and parallel to the surface of the substrate 10. The width W2 of the second gate 121 may be a length of the second gate 121 in a direction perpendicular to an extension direction thereof and parallel to the surface of the substrate 10. Both the first gate 111 of the first transistor T1 and the second gate 121 of the second transistor T2 may be recessed into the substrate 10 to form a buried gate structure. Therefore, the first gate 111 and the second gate 121 can be formed synchronously to realize compatibility between fabrication processes of the first transistor T1 and the second transistor T2, which helps to increase integration density of the memory cell of the first transistor T1 and/or the second transistor T2 in a memory and reduces a size of the memory cell. The width W2 of the second gate 121 is set to be less than the width W1 of the first gate 111, so that a drive current of the second transistor T2 is greater than that of the first transistor T1, so as to meet different requirements of the drive currents of the first transistor T1 and the second transistor T2, and two different transistors can be integrated in a same memory, which complements advantages of the two transistors, thereby improving the performance of the memory and expanding the application field of the memory.

The substrate 10 may have a P-well region 101 which is doped by p-type ions. The first terminal 112 of the first transistor T1 and the second terminal 122 of the second transistor T2 are both sources or drains doped by n-type ions. If the first terminal 112 of the first transistor T1 is a drain, the other terminal of the first transistor T1 is a source. If the second terminal 122 of the second transistor T2 is a drain, the other terminal of the second transistor T2 is a source. Specifically, as shown in FIG. 1, the first transistor T1 and the second transistor T2 have a common terminal 16. The common terminal 16 is a common source of the first transistor T1 and the second transistor T2. The first gate 111 and the second gate 121 are located between the first terminal 112 and the common terminal 16 and between the second terminal 122 and the common terminal 16 respectively.

In one of the embodiments, the substrate 10 may have an N-well region 101 which is doped by N-type ions. The first terminal 112 of the first transistor and the second terminal 122 of the second transistor are both doped by p-type ions accordingly.

In one of the embodiments, the plurality of active regions have at least one first active region 23; the first active region 23 has two first transistors T1; and the two first transistors T1 are distributed on two opposite sides of an extension direction of the first active region 23, and the two first transistors T1 located in the first active region 23 have a first common terminal.

Figure 2:
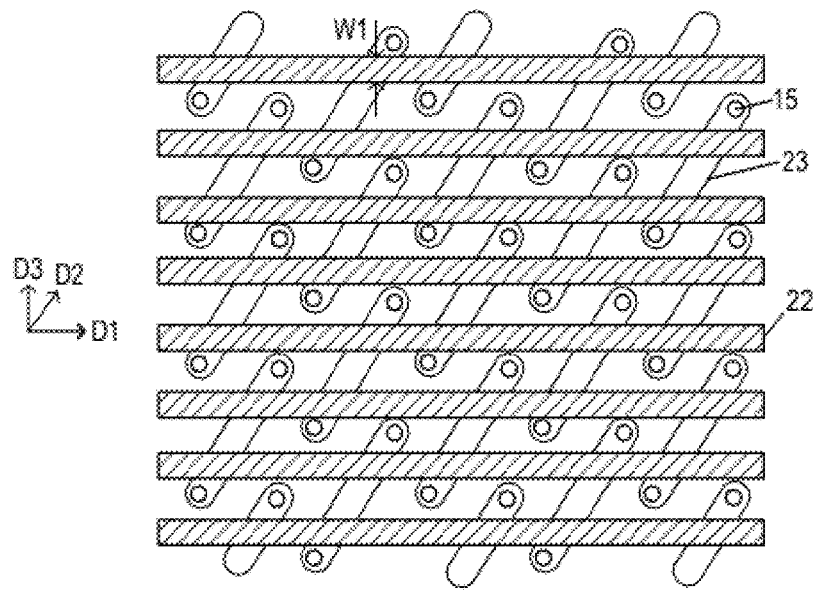
FIG. 2 is a schematic structural diagram of an arrangement of a plurality of first active regions according to a specific implementation of an embodiment.

FIG. 2 is a schematic structural diagram of an arrangement of a plurality of first active regions according to a specific implementation of an embodiment. For example, as shown in FIG. 2, the substrate 10 has a plurality of wordlines 22 extending in a first direction D1. The plurality of wordlines 22 are arranged in parallel in a third direction D3 perpendicular to the first direction D1. The plurality of first active regions 23 are arranged in an array in the substrate 10, and each first active region 23 extends in a second direction D2. The second direction D2 is tilted by a preset angle relative to the first direction D1. A specific value of the preset angle may be set by those skilled in the art according to an actual requirement. For example, the preset angle may be greater than or equal to 15 degrees and less than 30 degrees. Two wordlines 22 pass through one first active region 23 and control two first transistors T1 on the first active region 23 respectively. The first gates 111 of the two first transistors T1 are located in a substrate 10 and have a same width. The two first transistors T1 are distributed on two opposite sides of the first active region 23 in the second direction D2. It may be understood that the first gate 111 may be part of the wordline 22 on the first transistor T1 of the first active region 23. Specifically, as shown in FIG. 2, the substrate 10 includes a plurality of first active regions 23 and shallow trench isolation structures between the first active regions 23. The wordlines 22 passes through the plurality of first active regions 23 and the shallow trench isolation structures between the first active regions 23. An overlapping portion between the wordlines 22 and the first active region 23 may be the first gate 111. The width W1 of the first gate 111 is a width of the first gate 111 in the third direction D3, that is, a width of the wordline 22 in FIG. 2. First terminals 112 of the two first transistors T1 are both located on a surface of the substrate 10, and the two first transistors T1 share a first common terminal. For example, the first terminal 112 of the first transistor T1 is a drain terminal, the first common terminal is a first common source terminal, and the two first transistors T1 located in a same first active region 23 share the first common source terminal. The first common terminal may be arranged in the middle of the first active region 23. The two first transistors T1 located in the same first active region 23 are electrically connected to two first-type memory cells 15 respectively.

In one of the embodiments, the plurality of active regions have at least one second active region 24; the second active region 24 has two second transistors T2; and the two second transistors T2 are distributed on two opposite sides of an extension direction of the second active region 24, and the two second transistors T2 located in the second active region 24 have a second common terminal.

Figure 3:
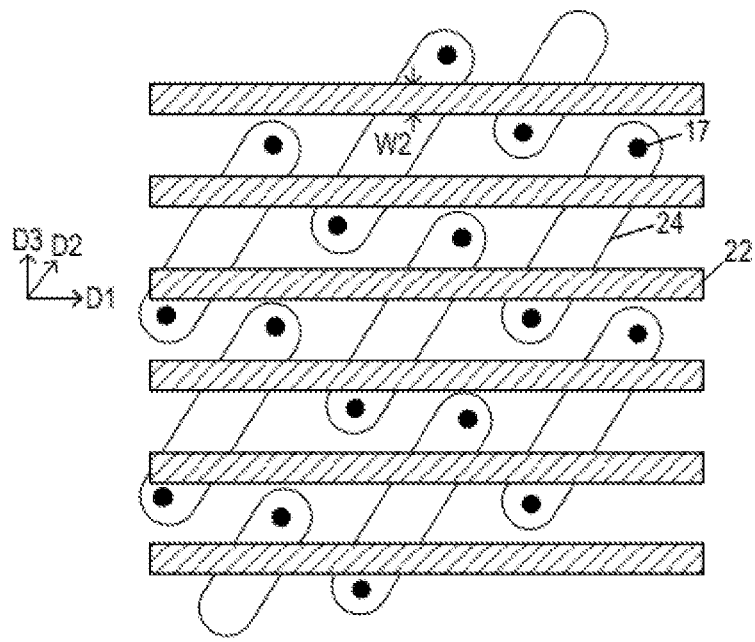
FIG. 3 is a schematic structural diagram of an arrangement of a plurality of second active regions according to a specific implementation of an embodiment.

FIG. 3 is a schematic structural diagram of an arrangement of a plurality of second active regions 24 according to a specific implementation of an embodiment. For example, as shown in FIG. 3, the substrate 10 has a plurality of wordlines 22 extending in a first direction D1. The plurality of wordlines 22 are arranged in parallel in a third direction D3 perpendicular to the first direction D1. The plurality of second active regions 24 are arranged in an array in the substrate 10, and each second active region 24 extends in a second direction D2. The second direction D2 is tilted by a preset angle relative to the first direction D1. A specific value of the preset angle may be set by those skilled in the art according to an actual requirement. For example, the preset angle may be greater than or equal to 30 degrees and less than 90 degrees. Two wordlines 22 pass through one second active region 24 and control two second transistors T2 on the second active region 24 respectively. The second gates 121 of the two second transistors T2 are located in the substrate 10 and have a same width. The two second transistors T2 are distributed on two opposite sides of the second active region 24 in the second direction D2. It may be understood that the second gate 121 may be part of the wordline 22 on the second transistor T2 of the second active region 24. Specifically, as shown in FIG. 3, the substrate 10 includes a plurality of second active regions 24 and shallow trench isolation structures between the second active regions 24. The wordline 22 passes through the plurality of second active regions 24 and the shallow trench isolation structures between the second active regions 24. An overlapping portion between the wordline 22 and the second active region 24 may be the second gate 121. The width W2 of the second gate 121 is a width of the second gate 121 in the third direction D3, that is, a width of the wordline 22 in FIG. 3. Second terminals 122 of the two second transistors T2 are both located on a surface of the substrate 10, and the two second transistors T2 share a second common terminal. For example, the second terminal 122 of the second transistor T2 is a drain terminal, the second common terminal is a second common source terminal, and the two second transistors T2 located in a same second active region 24 share the second common source terminal. The second common terminal may be arranged in the middle of the second active region 24. The two second transistors T2 located in the same second active region 24 are electrically connected to two second-type memory cells 17 respectively.

In one of the embodiments, the plurality of active regions have at least one third active region 25; the third active region 25 has a first transistor T1 and a second transistor T2; and the first transistor T1 and the second transistor T2 are distributed on two opposite sides of an extension direction of the third active region 25, and the first transistor T1 and the second transistor T2 located in the third active region 25 have a third common terminal.

In one of the embodiments, the semiconductor structure further includes a plurality of wordlines 22 extending in a first direction D1. The plurality of third active regions 25 are arranged in an array in the substrate 10, the third active regions 25 extend in a second direction D2, and the second direction D2 is tilted by a preset angle relative to the first direction D1.

Figure 4:
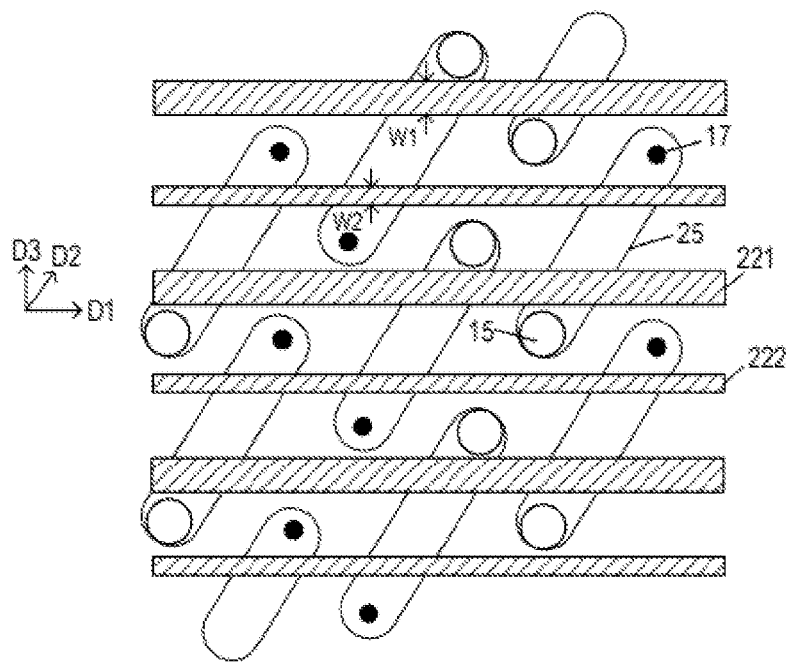
FIG. 4 is a schematic structural diagram of one arrangement of a plurality of third active regions according to a specific implementation of an embodiment.

FIG. 4 is a schematic structural diagram of another arrangement of the plurality of third active regions 25 according to a specific implementation of an embodiment. For example, as shown in FIG. 4, the substrate 10 has a plurality of wordlines 22 extending in a first direction D1. The plurality of wordlines 22 are arranged in parallel in a third direction D3 perpendicular to the first direction D1. The plurality of third active regions 25 are arranged in an array in the substrate 10, and each third active region 25 extends in a second direction D2. The second direction D2 is tilted by a preset angle relative to the first direction D1. A specific value of the preset angle may be set by those skilled in the art according to an actual requirement. For example, the preset angle may be greater than or equal to 15 degrees and less than 30 degrees. Each third active region 25 has a first transistor T1 and a second transistor T2. The first transistor T1 and the second transistor T2 are distributed on two opposite sides of the third active region 25 in the second direction D2. Two wordlines 22 pass through one third active region 25 and control the first transistor T1 and the second transistor T2 on the third active region 25 respectively. It may be understood that the first gate 111 may be part of the wordline 22 on the first transistor T1 of the third active region 25. The second gate 121 may be part of the wordline 22 on the second transistor T2 of the third active region 25. Specifically, as shown in FIG. 4, the substrate 10 includes a plurality of third active regions 25 and shallow trench isolation structures between the third active regions 25. The wordlines 22 passes through the plurality of third active regions 25 and the shallow trench isolation structures between the third active regions 25. An overlapping portion between the wordlines 22 and the first transistor T1 of the third active region 25 may be the first gate 111, and an overlapping portion between the wordlines 22 and the second transistor T2 of the third active region 25 may be the second gate 121. The width W1 of the first gate 111 is a width of the first gate 111 in the third direction D3, and the width W2 of the second gate 121 is a width of the second gate in the third direction D3. The first terminal 112 of the first transistor and the second terminal 122 of the second transistor are both located on a surface of the substrate 10 and the first transistor T1 and the second transistor T2 located in a same third active region 25 share a third common terminal. For example, the first terminal 112 of the first transistor T1 is a drain terminal, the second terminal 122 of the second transistor T2 is a drain terminal, the third common terminal is a third common source terminal, and the first transistor T1 and the second transistor T2 located in the same third active region 25 share the third common source terminal. In the same third active region 25, the first terminal 112 of the first transistor T1 is configured to be electrically connected to the first-type memory cell 15, and the second terminal 122 of the second transistor T2 is configured to be electrically connected to the second-type memory cell 17.

In one of the embodiments, in the second direction D2, ends of two adjacent third active regions 25 close to each other are both the first transistor T1 or both the second transistor T2.

In one of the embodiments, one third active region 25 overlaps with two adjacent wordlines 22; and the first transistor T1 and the second transistor T2 located in a same third active region 25 correspond to the two wordlines 22 respectively.

Specifically, the ends of two adjacent third active regions 25 close to each other in the extension direction of the third active regions 25 have a same transistor type, and the first transistor T1 and the second transistor T2 located in the same third active region 25 correspond to the two wordlines 22 respectively, so that the first transistor T1 and the second transistor T2 located in the same third active region 25 can be drive through the two wordlines 22 respectively, which simplifies the drive efficiency of two types of transistors in the same third active region 25.

In one of the embodiments, the wordline 22 includes first subwordlines 221 and second subwordlines 222 arranged alternately in a third direction D3, the third direction D3 being perpendicular to the first direction D1;

the first transistors T1 in the plurality of third active regions 25 arranged in the first direction D1 overlap with a same first subwordline 221; and the second transistors T2 in the plurality of third active regions 25 arranged in the first direction D1 overlap with a same second subwordline 222.

In one of the embodiments, a width of the second subwordline 222 is less than a width of the first subwordline 221.

Specifically, as shown in FIG. 4, the plurality of third active regions 25 are arranged in an array, and each third active region 25 extends in a second direction D2. The wordline 22 includes first subwordlines 221 and second subwordlines 222 arranged alternately in a third direction D3, each first subwordline 221 and each second subwordline 222 extend in the first direction D1, the third direction D3 is perpendicular to the first direction D1, and the second direction D2 is tilted by a preset angle relative to the first direction D1. A part of the first subwordline 221 may serve as the first gate 111 of the first transistor T1; that is, an extension direction of the first gate 111 is the same as that of the first subwordline 221. A part of the second subwordline 222 may serve as the second gate 121 of the second transistor T2; that is, an extension direction of the second gate 121 is the same as that of the second subwordline 222. The width of the second subwordline 222 is less than the width of the first subwordline 221; that is, the width of the second gate 121 is less than the width of the first gate 111. The first transistors T1 or the second transistors T2 in the plurality of third active regions 25 can be driven by driving the first subwordlines 221 or the second subwordlines 222 separately, so as to adjust a memory state of the first-type memory cell 15 or the second-type memory cell 17 separately.

In one of the embodiments, the width of the second gate 121 is ⅓ to ½ of the width of the first gate 111.

Specifically, when the first terminal 112 of the first transistor T1 is electrically connected to a capacitive memory cell, the second terminal 122 of the second transistor T2 is electrically connected to a magnetic memory cell, and a same wordline 22 controls the first transistor T1 or the second transistor T2, optimized device performance can be obtained according to a range of a ratio of widths of the second gate 121 and the first gate 111. Specifically, a leakage current can be reduced as much as possible in a case where the first gate 111 has a larger width, and a drive current can be increased as much as possible in a case where the second gate 121 has a smaller width, thereby improving the device performance.

In one of the embodiments, in the first direction D1, in two adjacent third active regions 25, the first transistor T1 in one third active region 25 and the second transistor T2 in the other third active region 25 correspond to a same wordline 22, and the wordline 22 is periodically concave and convex.

Figure 5:
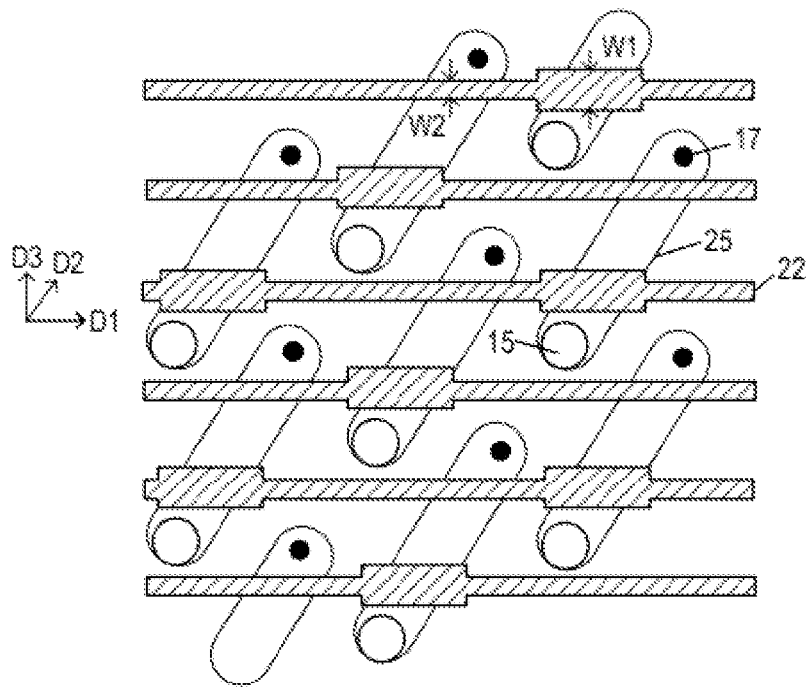
FIG. 5 is a schematic structural diagram of another arrangement of the plurality of third active regions according to a specific implementation of an embodiment.

FIG. 5 is a schematic structural diagram of another arrangement of the plurality of third active regions 25 according to a specific implementation of an embodiment. Specifically, as shown in FIG. 5, a width of each wordline 22 is increased at a position where the wordline 22 overlaps with the first transistor T1, instead of dividing the wordline into a first subwordline 221 and a second subwordline 222. In the first direction D1, in two adjacent third active regions 25, the first transistor T1 in one third active region 25 and the second transistor T2 in the other third active region 25 are close to each other, and a width of an overlapping part between a same wordline 22 and the second transistor T2 in an extension direction thereof is less than a width of an overlapping part between the wordline and the first transistor T1; therefore, the wordline 22 is periodically concave and convex on the whole. Specifically, part of the wordline 22 on the first transistor T1 of the third active region 25 is the first gate 111, and part of the wordline 22 on the second transistor T2 of the third active region 25 is the second gate 121. Drive currents of the first transistor T1 and the second transistor T2 can be adjusted by setting the wordline 22 to be periodically concave and convex, that is, setting the widths of the first gate 111 and the second gate 121 to be different. At the same time, a pitch between adjacent wordlines 22 can be increased, thereby avoiding crosstalk between the adjacent wordlines 22.

In one of the embodiments, the width of the second gate 121 is ½ to ⅔ of the width of the first gate 111.

Specifically, when the first terminal 112 of the first transistor T1 is electrically connected to a capacitive memory cell, the second terminal 122 of the second transistor T2 is electrically connected to a magnetic memory cell, and a same wordline 22 controls the first transistor T1 and the second transistor T2 at the same time, optimized device performance can be obtained according to a range of a ratio of widths of the second gate and the first gate, the difficulty of controlling the wordline 22 may be increased if the widths of the second gate 121 and the first gate 111 vary greatly. A ratio of the widths of the second gate 121 and the first gate 111 being within the above range can well balance requirements of the drive current and the control difficulty.

In one of the embodiments, the first-type memory cell 15 includes any one of a capacitive memory cell, a resistive memory cell, a magnetic memory cell, a phase change memory cell and a ferroelectric memory cell;

the second-type memory cell 17 includes any one of a capacitive memory cell, a resistive memory cell, a magnetic memory cell, a phase change memory cell and a ferroelectric memory cell; and the first-type memory cell 15 and the second-type memory cell 17 are of different memory types.

In one of the embodiments, the first-type memory cell 15 is the capacitive memory cell; and the second-type memory cell 17 is the magnetic memory cell.

For example, as shown in FIG. 1, the first-type memory cell 15 is a capacitive memory cell, and the second-type memory cell 17 is the magnetic memory cell (e.g., magnetic tunnel junction). The capacitive memory cell is electrically connected to the first terminal 112 of the first transistor through a first plug 14. A bottom end of the magnetic memory cell is connected to a bottom electrode 181, a top end of the magnetic memory cell is connected to a top electrode 182, the bottom electrode 181 is electrically connected to the second terminal 122 of the second transistor T2 through a second plug 20, and the top electrode 182 is electrically connected to a bitline 19 through a third plug 21.

Figure 6:
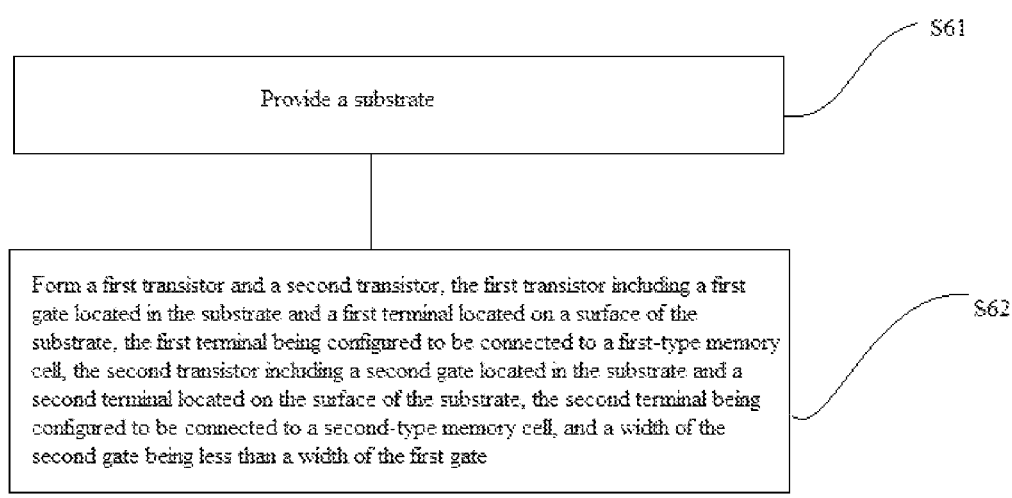
FIG. 6 is a flowchart of a semiconductor structure formation method according to a specific implementation of an embodiment.

In addition, this specific implementation further provides a semiconductor structure formation method. FIG. 6 is a flowchart of a semiconductor structure formation method according to a specific implementation of an embodiment. A schematic diagram of a semiconductor structure formed according to this specific implementation can be obtained with reference to FIG. 1, FIG. 4 and FIG. 5. As shown in FIG. 1 and FIG. 4 to FIG. 6, the semiconductor structure formation method according to this specific implementation comprises the following steps:

In step S61, a substrate 10 is provided.

In step S62, a first transistor T1 and a second transistor T2 are formed, the first transistor T1 including a first gate 111 located in the substrate 10 and a first terminal 112 located on a surface of the substrate 10, the first terminal 112 being configured to be connected to a first-type memory cell 15, the second transistor T2 including a second gate 121 located in the substrate 10 and a second terminal 122 located on the surface of the substrate 10, the second terminal 122 being configured to be connected to a second-type memory cell 17, and a width W2 of the second gate 121 being less than a width W1 of the first gate 111.

In one of the embodiments, the semiconductor structure formation method further comprises the following steps:
forming an active region in the substrate 10;
forming a first gate groove and a second gate groove in the active region, a width of the second gate groove being less than a width of the first gate groove, the active region being divided by the first gate groove and the second gate groove into the first terminal 112, the second terminal 122 and a common terminal 16 between the first terminal and the second terminal; and
filling the first gate groove and the second gate groove with a gate material, to form the first gate 111 and the second gate 121.

In one of the embodiments, the substrate 10 further comprises a plurality of wordlines 22 extending in a first direction D1; and
a plurality of active regions are arranged in an array in the substrate 10, the active regions extend in a second direction D2, and the second direction D2 is tilted by a preset angle relative to the first direction D1.

In one of the embodiments, in the second direction D2, ends of two adjacent active regions close to each other are both the first transistor T1 or the second transistor T2.

In one of the embodiments, one active region overlaps with two adjacent wordlines 22; and
the first transistor and the second transistor located in a same active region correspond to the two wordlines 22 respectively.

In one of the embodiments, the wordline 22 comprises first subwordlines 221 and second subwordlines 222 arranged alternately in a third direction D3, the third direction D3 being perpendicular to the first direction D1;
the first transistors T1 in the plurality of active regions arranged in the first direction D1 overlap with a same first subwordline 221; and
the second transistors T2 in the plurality of active regions arranged in the first direction D1 overlap with a same second subwordline 222.

In one of the embodiments, a width of the second subwordline 222 is less than a width of the first subwordline 221.

In one of the embodiments, in the first direction D1, in two adjacent active regions, the first transistor T1 in one active region and the second transistor T2 in the other active region correspond to a same wordline 22, and the wordline is periodically concave and convex.

In one of the embodiments, the first-type memory cell 15 comprises any one of a capacitive memory cell, a resistive memory cell, a magnetic memory cell, a phase change memory cell and a ferroelectric memory cell;
the second-type memory cell 17 comprises any one of a capacitive memory cell, a resistive memory cell, a magnetic memory cell, a phase change memory cell and a ferroelectric memory cell; and
the first-type memory cell 15 and the second-type memory cell 17 are of different memory types.

In one of the embodiments, the first-type memory cell 15 is the capacitive memory cell; and
the second-type memory cell 17 is the magnetic memory cell.

In the semiconductor structure and the formation method thereof according to the specific implementations, the first transistor connected to the first-type memory cell and the second transistor connected to the second-type memory cell are arranged simultaneously in the semiconductor structure, a first channel region of the first transistor and a second channel region of the second transistor are both located in the substrate, and the width of the second gate of the second transistor is less than the width of the first gate of the first transistor, so as to achieve an effect of enabling a fabrication process of the first transistor to be compatible with a fabrication process of the second transistor, thereby simplifying a fabrication method of the semiconductor structure. Moreover, the drive current of the first transistor can be ensured to be less than that of the second transistor, which helps to increase integration density of the memory cell of the first transistor and/or the second transistor in a memory, reduces a size of the memory cell, improves performance of the memories, and lays a foundation for expansion of the application field of the memory.

The above are merely preferred implementations of the disclosure. It should be pointed out that, those of ordinary skill in the art may further make several improvements and modifications without departing from the principle of the disclosure. Such improvements and modifications should also fall within the protection scope of the disclosure.

What is claimed is:
1. A semiconductor structure, comprising:
a substrate;
a first transistor comprising a first gate located in the substrate and a first terminal located on a surface of the substrate, the first terminal being configured to be connected to a first-type memory cell;
a second transistor comprising a second gate located in the substrate and a second terminal located on the surface of the substrate, the second terminal being configured to be connected to a second-type memory cell, and a width of the second gate being less than a width of the first gate;

a plurality of active regions arranged in an array in the substrate;

a shallow trench isolation structure located between the plurality of active regions; and, wherein the plurality of active regions have at least one third active region; the third active region having the first transistor and the second transistor;

the first transistor and the second transistor being distributed on two opposite sides of an extension direction of the third active region, and the first transistor and the second transistor located in the third active region having a third common terminal.

2. The semiconductor structure according to claim 1, further comprising a plurality of wordlines extending in a first direction;

a plurality of the third active regions being arranged in the array in the substrate, the plurality of the third active regions extending in a second direction, and the second direction is tilted by a preset angle relative to the first direction.

3. The semiconductor structure according to claim 2, wherein in the second direction, ends of adjacent two of the third active regions close to each other are both the first transistor or the second transistor.

4. The semiconductor structure according to claim 3, wherein one of the third active regions overlaps with adjacent two of the plurality of wordlines; and the first transistor and the second transistor located in the one of the third active region regions correspond to the adjacent two of the plurality of wordlines respectively.

5. The semiconductor structure according to claim 4, wherein the plurality of wordlines comprises first subwordlines and second subwordlines arranged alternately in a third direction, the third direction being perpendicular to the first direction;

the first transistor in the plurality of the third active regions arranged in the first direction overlap with the same first subwordline; and the second transistor in the plurality of the third active regions arranged in the first direction overlap with the same second subwordline.

6. The semiconductor structure according to claim 5, wherein a width of the second subwordlines is less than a width of the first subwordlines.

7. The semiconductor structure according to claim 6, wherein the width of the second gate is ⅓ to ½ of the width of the first gate.

8. The semiconductor structure according to claim 2, wherein in the first direction, in adjacent two of the plurality of the third active regions, the first transistor in one of the third active regions and the second transistor in the other one of the third active regions correspond to same one of the plurality of wordlines, and the one of the plurality of wordlines is periodically concave and convex.

9. The semiconductor structure according to claim 8, wherein the width of the second gate is ½ to ⅔ of the width of the first gate.

10. A method of forming a semiconductor structure, comprising:

providing a substrate; and forming a first transistor and a second transistor, the first transistor comprising a first gate located in the substrate and a first terminal located on a surface of the substrate, the first terminal being configured to be connected to a first-type memory cell, the second transistor comprising a second gate located in the substrate and a second terminal located on the surface of the substrate, the second terminal being configured to be connected to a second-type memory cell, and a width of the second gate being less than a width of the first gate;

forming an active region in the substrate;

forming a first gate groove and a second gate groove in the active region, a width of the second gate groove being less than a width of the first gate groove, the active region being divided by the first gate groove and the second gate groove into the first terminal, the second terminal and a common terminal between the first terminal and the second terminal; and filling the first gate groove and the second gate groove with a gate material, to form the first gate and the second gate.

11. The method according to claim 10, wherein the substrate further comprises a plurality of wordlines extending in a first direction; and a plurality of the active regions are arranged in an array in the substrate, the active regions extend in a second direction, and the second direction is tilted by a preset angle relative to the first direction.

12. The method according to claim 11, wherein in the second direction, ends of two adjacent the active regions close to each other are both the first transistor or the second transistor.

13. The method according to claim 12, wherein one active region overlaps with adjacent two of the plurality of wordlines; and the first transistor and the second transistor located in same one of the active regions correspond to the adjacent two of the plurality of wordlines respectively.

14. The method according to claim 13, wherein the plurality of wordlines comprises first subwordlines and second subwordlines arranged alternately in a third direction, the third direction being perpendicular to the first direction;

the first transistor in the plurality of active regions arranged in the first direction overlap with same one of the first subwordlines; and the second transistor in the plurality of active regions arranged in the first direction overlap with same one of the second subwordlines.

15. The method according to claim 11, wherein in the first direction, in two adjacent the active regions, the first transistor in one of the two adjacent the active regions and the second transistor in the other one of the two adjacent the active regions correspond to same one of the plurality of wordlines, and the one of the plurality of wordlines is periodically concave and convex.

* * * * *